United States Patent
Dekkers et al.

(10) Patent No.: US 7,135,923 B2
(45) Date of Patent: Nov. 14, 2006

(54) DIFFERENTIAL AMPLIFIER

(75) Inventors: Jan Cornelus Albert Dekkers, Eindhoven (NL); Dominicus Martinus Wilhelmus Leenaerts, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 35 days.

(21) Appl. No.: 10/510,254

(22) PCT Filed: Mar. 20, 2003

(86) PCT No.: PCT/IB03/01191

§ 371 (c)(1),
(2), (4) Date: Oct. 5, 2004

(87) PCT Pub. No.: WO03/085821

PCT Pub. Date: Oct. 10, 2003

(65) Prior Publication Data

US 2005/0140444 A1 Jun. 30, 2005

(30) Foreign Application Priority Data

Apr. 8, 2002 (EP) .................................. 02076400

(51) Int. Cl.
*H03F 3/45* (2006.01)

(52) U.S. Cl. ...................................... 330/252; 330/260
(58) Field of Classification Search ................ 330/258, 330/295, 252, 253, 84
See application file for complete search history.

(56) References Cited

U.S. PATENT DOCUMENTS 4,887,047 A   12/1989  Somerville .................. 330/257
6,720,830 B1 * 4/2004  Andreou et al. ............ 330/253

* cited by examiner

*Primary Examiner*—Robert Pascal
*Assistant Examiner*—Hieu Nguyen
(74) *Attorney, Agent, or Firm*—Aaron Waxler

(57) ABSTRACT

A differential amplifier for amplifying an input differential signal having two components (In+, In−) substantially in anti-phase to each other and generating an output differential signal having two differential components (Out+, Out−). The amplifier comprises a pair of inverters coupled to a pair of adders the inverters receiving the input differential signal. The amplifier is characterized in that it further comprises a pair of controllable buffers for receiving the input differential signal and outputting a signal to the pair of adders. A bias of the said pair of buffers is cross-controlled by the input differential signal for controlling an amplification of said pair of controllable buffers.

10 Claims, 4 Drawing Sheets

DIFFERENTIAL AMPLIFIER

Figure 1:
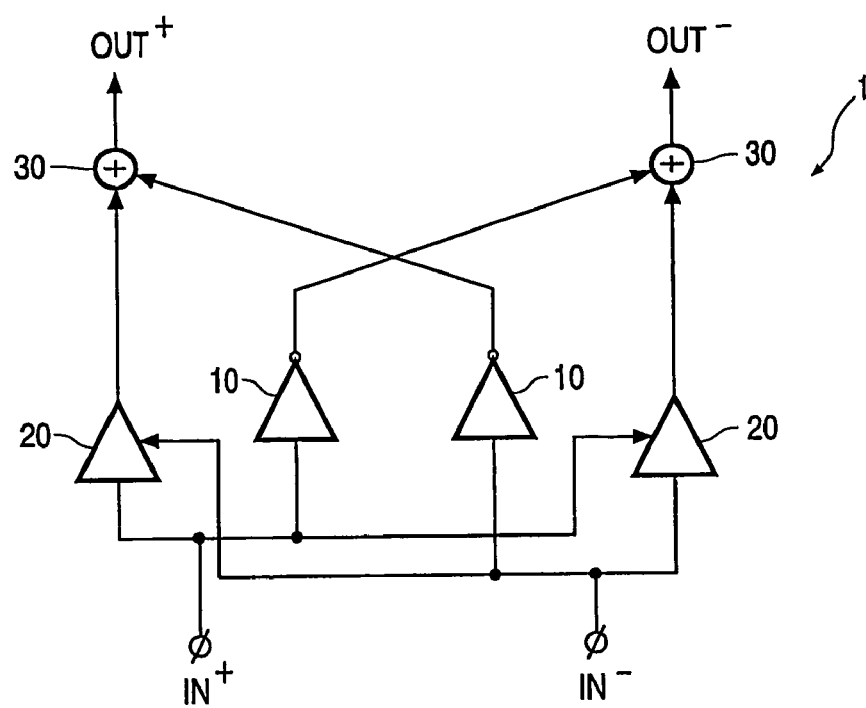

The status of all parent priority applications as of Mar. 1, 2006, is as follows: Priority Application EP02076400.7 is now abandoned.

The invention relates to a differential amplifier according to the preamble of claim 1.

The invention further relates to a receiver comprising the differential amplifier.

Differential amplifiers are widely used in various applications because they provide a relatively good common mode rejection ratio and relatively high output signal ranges e.g. theoretically the output signal range could be double as a range that could be obtained with a single ended amplifier. When they are used as input amplifiers they have to provide a relatively low noise and a linear amplification. In modern communication circuits these features have to be obtained having input signals situated in a relatively high frequency range i.e. GHz the circuits being supplied by a relatively low voltage.

A possible solution could be as in U.S. Pat. No. 4,887,047. In this patent it is presented a differential amplifier usable in medical applications. The input signals are considered to be currents, said signals being DC free i.e. they have no DC component. The amplifier has nonlinear input impedance and a differential cross-coupled transistor pair. Current mirrors supplied by a current source for obtaining an as high as possible amplification are provided. The currents provided by the current sources and by the differential cross—coupled transistor pair are added to each other in the output nodes, the output nodes acting as a current adder. It is observed that the transistors included in the differential cross—coupled transistor pair acts as inverters i.e. a phase shift between the output signal and the input signal is substantially 180 degrees. It should be emphasized that the medical signals are impulse shaped current signals and the differential amplifier has to sense and to amplify these signals. The amplifier senses the edges of the input signals providing at it's output impulse shaped signals whenever a transition from a low level to a high level or from a high level to a low level occurs in the input signal. It is observed that this amplifier is not suitable to be used in communication circuits because it does not provide a linear amplification when the input signals have a smooth continuous transition from a low level to a high level i.e. they are not pulse shaped. Furthermore, the circuit is not suitable to be used with signals having a DC component. It is further observed that the noise performance of this circuit is realized using a nonlinear input device i.e. a diode and a small input impedance. These solutions are not suitable for high frequency amplifiers used in communications.

It is therefore an object of the present invention to provide a differential amplifier having an improved linearity and better noise immunity.

In accordance with the invention this is achieved in a device as described in the introductory paragraph which is characterized in that the amplifier further comprises a pair of controllable buffers for receiving the input differential signal and for outputting a signal to the pair of adders, a bias of the said pair of buffers being cross-controlled by the input differential signal for controlling an amplification of said pair of controllable buffers. An amplification of the buffers depends on the input signals such that the linearity is insured for relatively large amplitude signal ranges. In the same time the control of the buffers bias improves the noise figure of the amplifiers because the noise is dependent on the bias.

In an embodiment of the invention the pair of inverters and the pair of controllable buffers are voltage to current converters. This feature is important for modern communication systems, wired or wireless where a large majority of signals are voltage signals. Because the amplifier provides at it's output current signals the adders are relatively easier to be implemented reducing the cost of the amplifier.

In another embodiment of the amplifier adders comprises a series combination of two resistive means. This is the simplest way to implement the adder. A ratio between the resistors included in the adder determines the amount of positive feedback that determines the overall amplification of the amplifier.

In an embodiment of the amplifier the differential amplifier is coupled to a current to voltage converter for adapting a current type differential input signal to a voltage type differential signal said voltage being inputted to the differential amplifier. It is observed that some of the communication systems as optical networks provides at their inputs optical transducers e.g. photo-transistors an output signal of these transducers being current type signals. Hence, the current type signals have to be first converted into a voltage the respective voltage being inputted to the differential amplifier. This feature increases the versatility in applications of the differential amplifier according to the invention.

In another embodiment of the invention the pair of inverters comprises a pair of common-emitter coupled transistors. Furthermore, the pair controllable buffers comprises a pair of common-base transistors. The common-base transistors are cross-coupled to the differential input signal via capacitive means for removing a DC component included in the differential input signal. The DC bias of the common-base transistors and common-emitter transistors is realized with current sources while the bias of the common-base transistors is further controlled by the input signal. The control signal is DC free for implementing a control depending only on an AC component of the input signal. Hence the control depends only on the variable part of the input signal, the variable part of the input signal carrying the useful information in the input signal. This control implements a feedback from the input to the buffers improving the overall stability of the differential amplifier and it's linearity.

In another embodiment of the amplifier the pair of common-emitter transistors has a first feedback means for controlling an amplification of said pair of transistors. The first feedback means also increase the input impedance for better adapting the common-emitter pair to a voltage type input signal. In the same time the linearity of the amplifier increases.

In another embodiment of the invention the pair of common-base transistors comprises a pair of second feedback means for adapting an input impedance of the pair of common-base transistors to an output impedance of a generator, said generator transmitting the differential input signal. The second feedback means increases the input impedance of the common-base transistors and, in the same time, improves the linearity of the amplifier.

In an embodiment of the invention a receiver comprises the differential amplifier. Because of it's improved linearity and noise figure, the differential amplifier is used as a Low Noise Amplifier (LNA) in a receiver, said LNA being the input stage in the receiver.

Figure 2:
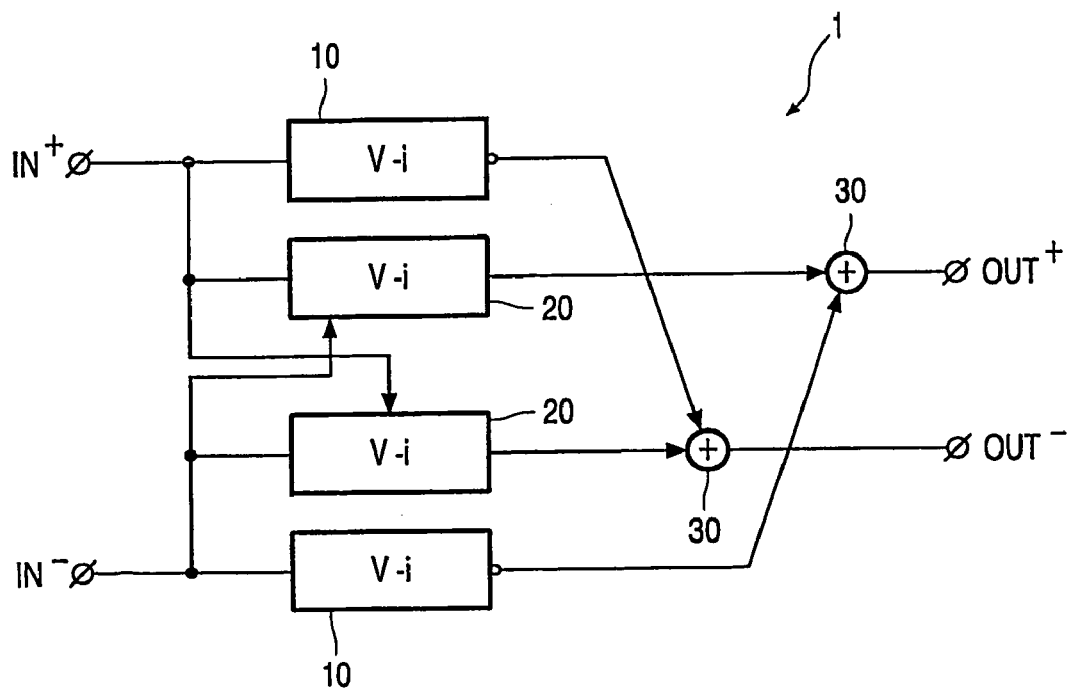
Figure 3:
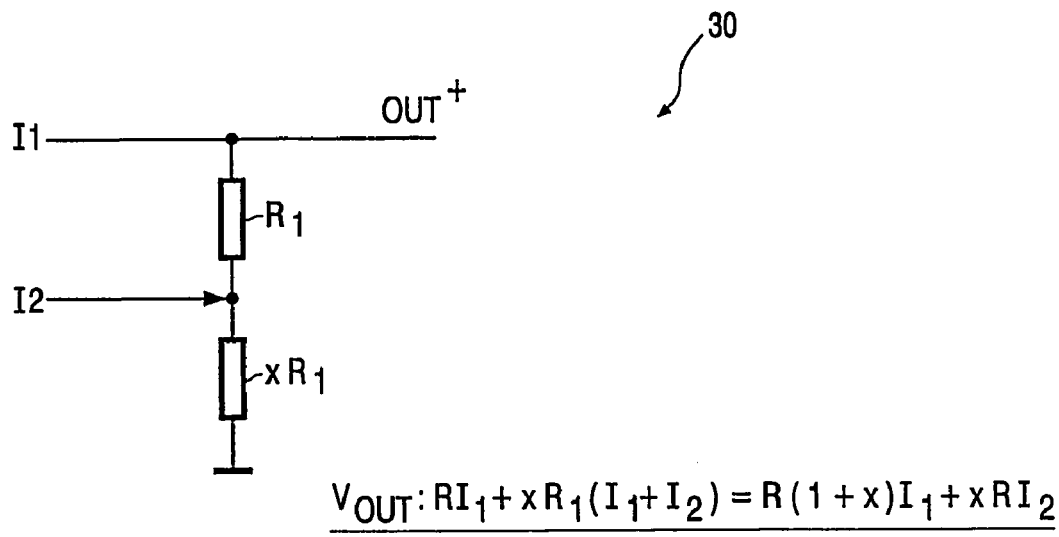
Figure 4:
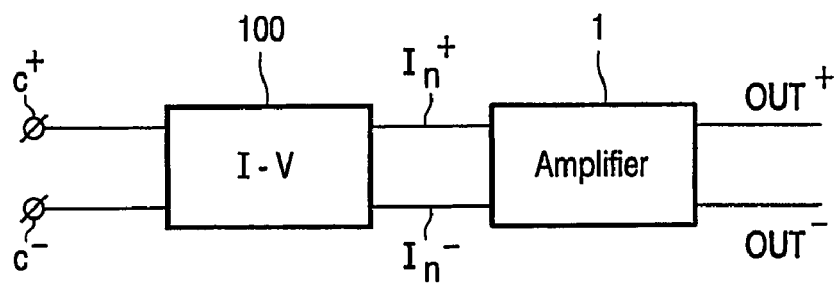
Figure 5:
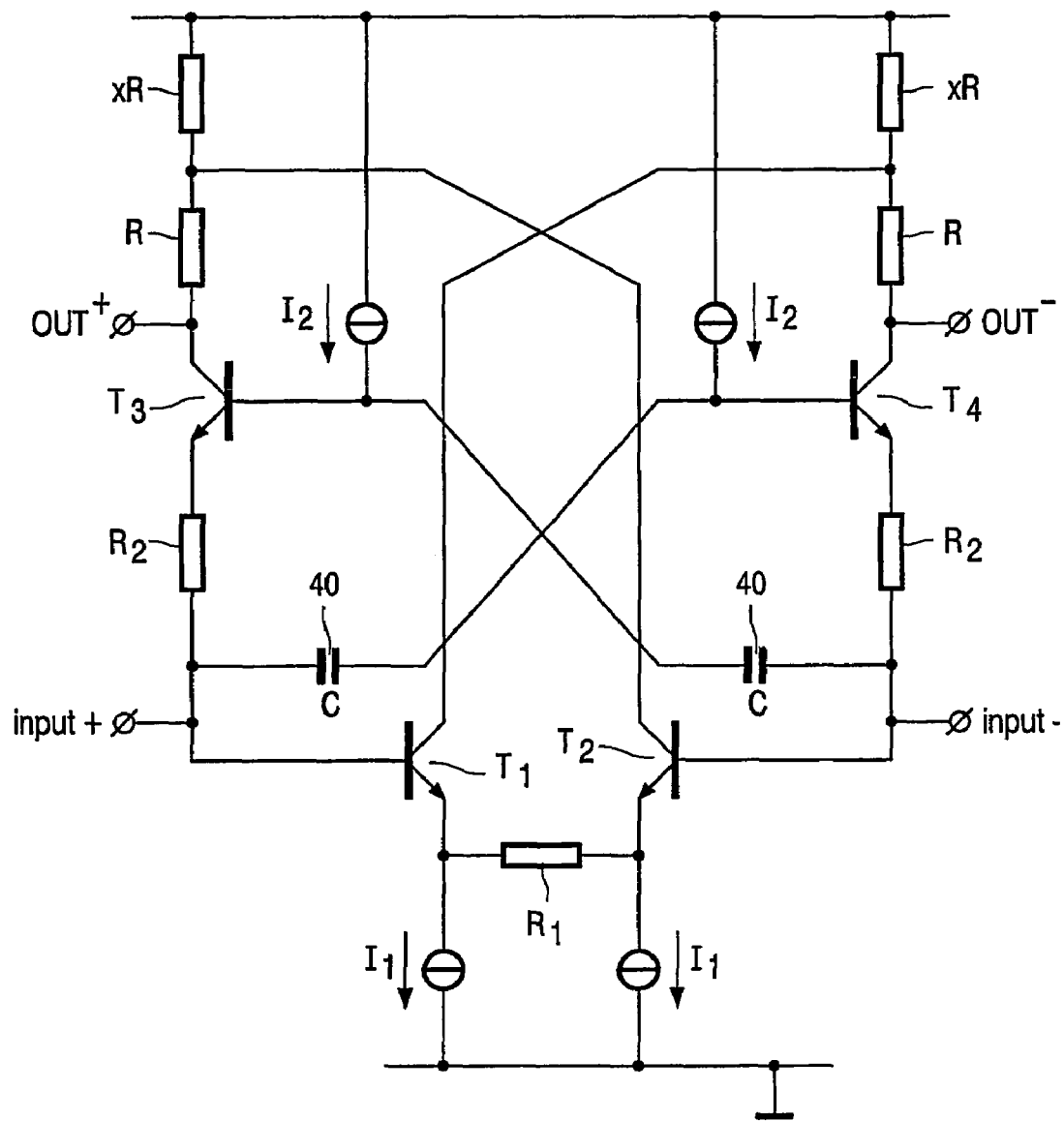
Figure 6:
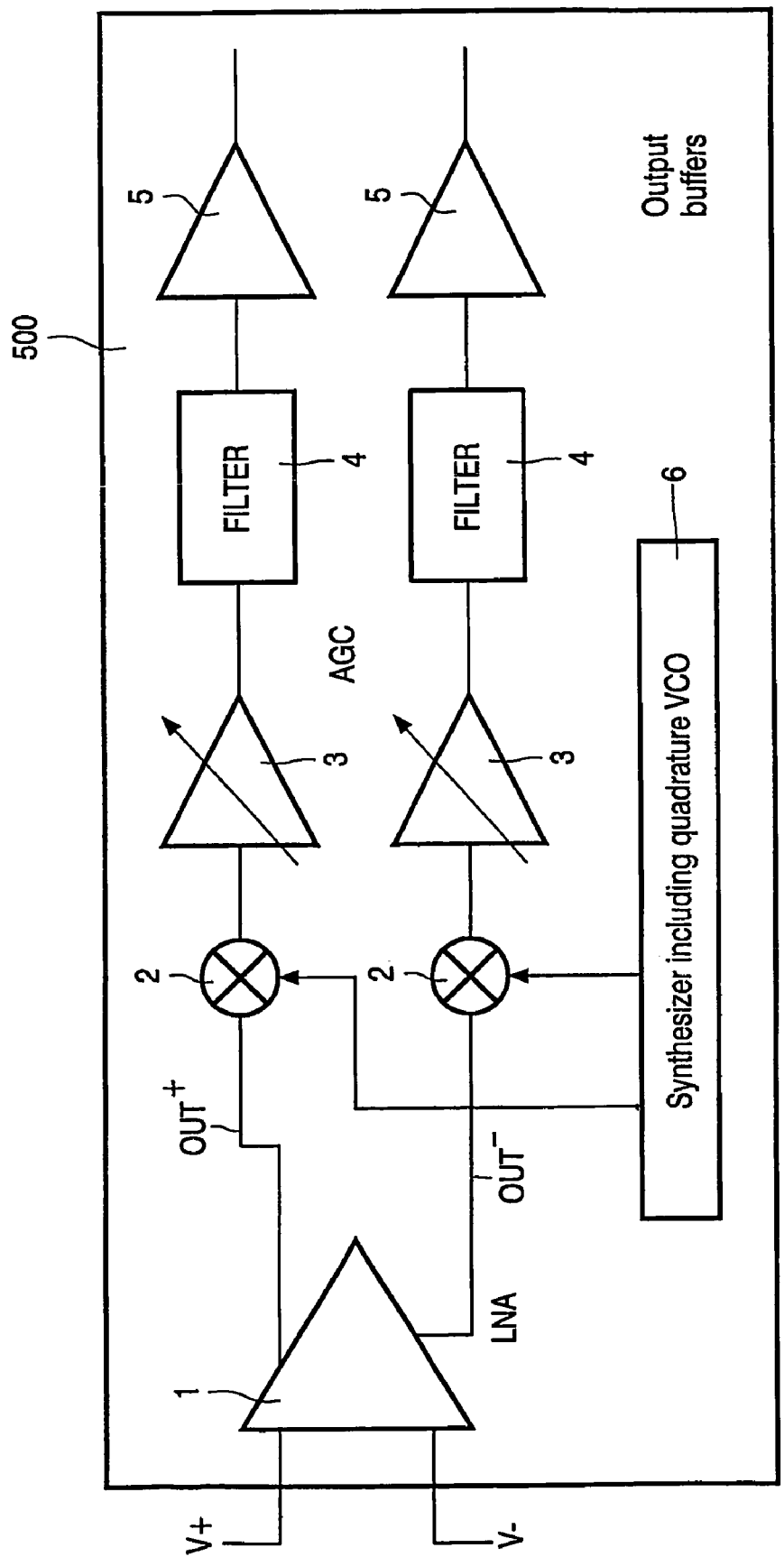

The above and other features and advantages of the invention will be apparent from the following description of exemplary embodiments of the invention with reference to the accompanying drawings, in which:

FIG. 1 depicts a differential amplifier according to the invention,

FIG. 2 depicts a differential amplifier implemented with voltage to current converters according to an embodiment of the invention, FIG. 3 depicts an adder according to another embodiment of the invention, FIG. 4 depicts an amplifier adapted to current type input signals according to an embodiment of the invention, FIG. 5 depicts an amplifier implemented with bipolar transistors according to an embodiment of the invention, FIG. 6 depicts a receiver using the amplifier according to another embodiment of the invention.

FIG. 1 depicts a differential amplifier according to the invention. The amplifier is adapted to process differential input signals, said signals having two components $In^+$, $In^-$, substantially in anti-phase to each other. The amplifier comprises a pair of inverters 10 cross-coupled to a pair of adders 30, the inverters 10 receiving the input differential signal. The amplifier further comprises a pair of controllable buffers 20 for receiving the input differential signal and outputting a signal to the pair of adders 30. A bias of the said pair of buffers being cross-controlled by the input differential signal for performing a linear amplification of the input signal. It is observed any adder 30 receives two in-phase signals one signal being generated by a controllable buffer 20 and by an inverter 10. Hence the output signal has a relatively large value. When relatively large input signals are provided the amplifier could limit their amplitude i.e. a nonlinear behavior that is not desired in a linear amplifier. Therefore, a feedback is provided to control the bias of the buffers. When a relatively large voltage $In^+$ appears, a relatively large anti-phase voltage $In^-$ also appears. The anti-phase voltage determines a modification of the bias voltage of the buffer 20 determining a decrease of an amplification of the buffer. This decrease further determines that an output differential signal is transmitted without distortions and the overall amplification of the amplifier is linear. The amplifiers are voltage controlled and could be operational amplifiers, transconductance amplifiers, CMOS buffers and inverters.

FIG. 2 depicts a differential amplifier implemented with voltage to current converters according to an embodiment of the invention. In this embodiment of the invention the pair of inverters 10 and the pair of controllable buffers 20 are voltage to current converters. This feature is important for modern communication systems, wired or wireless, in which a large majority of signals are voltage signals. Because the amplifier provides at it's output current signals the adders are relatively easier to be implemented reducing the cost of the amplifier. The voltage to current converters could be for instance transconductance amplifiers, bipolar or CMOS transistors, using materials as Si, SiGe, GaAs.

FIG. 3 depicts an adder according to another embodiment of the invention. Considering that a current outputted by a buffer is Ib and a current outputted by an inverter is Ii then an output voltage e.g. $OUT^+$ is as described in equation 1.

$$OUT^+ = R(1+x)Ib + xRIi \quad (1)$$

It results that the amplification depends on the resistors ratio x. Making these resistors controllable it is easier to control the amplification of the amplifier.

FIG. 4 depicts an amplifier adapted to current type input signals according to an embodiment of the invention. The differential amplifier is coupled to a current to voltage converter for adapting a current type differential input signal to a voltage type differential signal. The obtained voltage is inputted to the differential amplifier. It is observed that some communication systems as optical networks provide at their inputs optical transducers e.g. phototransistors. An output signal of these transducers is a current type signal. Hence, the current type signals have to be first converted into a voltage the respective voltage being inputted to the differential amplifier. This feature increases the versatility in applications of the differential amplifier according to the invention. Furthermore this helps in standardization of various type of amplifiers.

FIG. 5 depicts an amplifier implemented with bipolar transistors according to an embodiment of the invention. In FIG. 5 transistor pair T1, T2 is identified as pair of inverters 10 in FIG. 1. Analogously, transistor pair T3, T4 is identified as pair of controllable buffer 20. Current sources I1 and I2 bias the transistor pairs T1, T2 and T3, T4 respectively. It is observed that capacitive means 40 are provided for controlling the bias of the pair of controllable buffers. It is further observed that a first feedback means R1 is coupled between the emitters of the transistors T1, T2. A second feedback resistor means R2 are coupled to the emitters of the transistor pair T3, T4. The transistor pair T1, T2 is in so-called common emitter connection. The transistor pair T3, T4 is in so-called common base connection. The first resistive feedback R1 increases the input impedance of the amplifier, reducing the amplification. In this way larger input signals could be inputted to the stage. The second resistive feedback R2 increases the input impedance of the common base stage reducing in the same time the overall amplification of the stage. It is observed that the collector current of T2 is added to the output current of T3 in an adder implemented with the resistors R and xR. Analogously, the collector current of T1 is added to the current of the collector current of T4. In the same time a DC free signal depending on the input signal is inputted to the bases of transistors T2 and T3, said signal being substantially in anti-phase to the signal in their collectors. Hence, when $In^+$ is large the DC free feedback signal determined by $In^-$ signal reduces the base current of T3, reducing the amplification of the stage. Therefore, the feedback increases the linearity of the stage. It has to be observed that the concept presented in this invention could be implemented with pnp bipolar transistors, with CMOS transistors as obviously results for a skilled person in the art. There is a straightforward correspondence between base, emitter and collector terminals and gate (grid), source and drain terminals respectively. Furthermore, the circuit using npn bipolar transistors is equivalent to the circuits implemented with n channel CMOS transistors and the circuit implemented with pnp bipolar transistors is equivalent to circuit implemented with p-channel CMOS transistors.

FIG. 6 depicts a receiver 500 using the amplifier 1 according to another embodiment of the invention. The amplifier 1 is used as a low noise amplifier (LNA) receiving a differential input signal and generating a differential output signal. The differential output signal is inputted to a pair of mixers 2 for combining with a periodical quadrature signal generated by a synthesizer 6, said synthesizer including a quadrature voltage control oscillator (VCO). The periodical signal could have either a frequency that equals a frequency of a carrier of the input signal or a different frequency. In the first case we have a heterodyning receiver and in the second case we have a zero-IF receiver. The signal generated by the mixer 2 is inputted to automatic gain control amplifier (AGC) 3 for being further amplified. An amplified signal generated by the AGC amplifier 3 is inputted to a filter 4. In the case of the heterodyning receiver the filter is a band-pass filter and in the case of zero-IF receiver the filter is a low-pass filter. A filtered signal generated by the filter 4 is transmitted for further processing via output buffers 5, said buffers being conceived to perform an adaptation to further processing stages of a receiver system.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A differential amplifier (1) for amplifying an input differential signal having two components (In$^+$, In$^-$) substantially in anti-phase to each other and generating an output differential signal having two differential components (Out$^+$, Out$^-$), said amplifier (1) comprising a pair of inverters (10) coupled to a pair of adder components (30), each adder component comprising a resistor, the inverters (10) receiving the input differential signal, the amplifier (1) being characterized in that it further comprises a pair of controllable buffers (20) for receiving the input differential signal and outputting a signal to the pair of adder components (30), a bias of the said pair of buffers being cross-controlled by the input differential signal for controlling an amplification of said pair of controllable buffers (20).

2. A differential amplifier (1) as claimed in claim 1, wherein the pair of inverters (10) and the pair of controllable buffers (20) are voltage to current converters.

3. A differential amplifier (1) as claimed in claim 2, wherein the pair of adder components (30) comprises a series combination of resistive means (R, xR).

4. A differential amplifier (1) as claimed in claim 2, wherein the differential amplifier (1) is coupled to a current to voltage converter (100) for adapting a current type differential input signal (C$^+$, C$^-$) to a voltage type differential signal (In$^+$, In$^-$) said voltage being inputted to the differential amplifier (1).

5. A differential amplifier (1) as claimed in claim 2, wherein the pair of inverters (10) comprises a pair of common-emitter coupled transistors (T1, T2).

6. A differential amplifier (1) as claimed in claim 3, wherein the pair of controllable buffers (20) comprises a pair of common-base transistors (T3, T4).

7. A differential amplifier (1) as claimed in claim 6, wherein the pair of common-base transistors are cross-coupled to the differential input signal via capacitive means (40) for removing a DC component included in the differential input signal.

8. A differential amplifier (1) as claimed in claim 6, wherein the pair of common-emitter transistors (T1, T2) has a first feedback means (R1) for controlling an amplification of said pair of transistors (T1, T2).

9. A differential amplifier (1) as claimed in claim 7, wherein the pair of common-base transistors (T3, 74) comprises a pair of second feedback means (R2) for adapting an input impedance of the pair of common-base transistors (T3, T4) to an output impedance of a generator, said generator transmitting the differential input signal.

10. A receiver (500) comprising a differential amplifier (1) as claimed in claim 1.

* * * * *